(12) United States Patent
Braun et al.

(10) Patent No.: US 11,699,884 B2
(45) Date of Patent: Jul. 11, 2023

(54) ELECTROMAGNETIC SHIELDING OF HEATSINKS WITH SPRING PRESS-FIT PINS

(71) Applicant: INTERNATIONAL BUSINESS MACHINES CORPORATION, Armonk, NY (US)

(72) Inventors: David J. Braun, St. Charles, MN (US); John R. Dangler, Rochester, MN (US); Timothy P. Younger, Rochester, MN (US); James D. Bielick, Pine Island, MN (US); Stephen Michael Hugo, Stewartville, MN (US); Theron Lee Lewis, Rochester, MN (US); Jennifer I. Bennett, Rochester, MN (US); Timothy Jennings, Rochester, MN (US)

(73) Assignee: International Business Machines Corporation, Armonk, NY (US)

( * ) Notice: Subject to any disclaimer, the term of this patent is extended or adjusted under 35 U.S.C. 154(b) by 374 days.

(21) Appl. No.: 16/939,135

(22) Filed: Jul. 27, 2020

(65) Prior Publication Data
US 2022/0029361 A1 Jan. 27, 2022

(51) Int. Cl.
*H01R 13/00* (2006.01)
*H01R 13/6595* (2011.01)
(Continued)

(52) U.S. Cl.
CPC ..... *H01R 13/6595* (2013.01); *H01R 12/7064* (2013.01); *H05K 1/0209* (2013.01);
(Continued)

(58) Field of Classification Search
CPC ............ H01R 13/6595; H01R 12/7064; H01R 12/585; H01R 11/18; H05K 1/0209;
(Continued)

(56) References Cited

U.S. PATENT DOCUMENTS 4,341,432 A * 7/1982 Cutchaw ............. H01L 23/4006
174/16.3
4,783,899 A 11/1988 Breese
(Continued)

FOREIGN PATENT DOCUMENTS

KR 20010011519 A 2/2001
KR 20060091148 A 8/2006

OTHER PUBLICATIONS

Armstrong, "EMC Techniques for Heatsinks", The EMC Journal, Issue 89, Jul. 2010, https://www.emcstandards.co.uk/files/emc_techniques_for_heatsinks_july_2010.pdf pp. 31-38.
(Continued)

*Primary Examiner* — Anatoly Vortman
*Assistant Examiner* — Zhengfu J Feng
(74) *Attorney, Agent, or Firm* — Tihon Poltavets

(57) ABSTRACT

An apparatus for grounding a heatsink utilizing an EMC spring press-fit pin includes a printed circuit board, a logic chip, a heatsink, and a grounding member, where the grounding member includes an integrated spring and a first terminal pin at a first end of the grounding member. The logic chip is electrically coupled to the printed circuit board and the heatsink is disposed on a top surface of the logic chip. The first terminal pin at the first end of the grounding member is disposed in a plated-through hole of the printed circuit, where the grounding member is configured to electrically couple the heatsink to the printed circuit board.

4 Claims, 8 Drawing Sheets

(51) Int. Cl.
  *H05K 1/02* (2006.01)
  *H05K 9/00* (2006.01)
  *H01R 12/70* (2011.01)
  *H05K 7/20* (2006.01)
  *H01R 12/58* (2011.01)
  *H01R 11/18* (2006.01)

(52) U.S. Cl.
  CPC ............ *H05K 7/20* (2013.01); *H05K 9/0028* (2013.01); *H01R 11/18* (2013.01); *H01R 12/585* (2013.01); *Y10S 439/948* (2013.01)

(58) Field of Classification Search
  CPC .................. H05K 7/20; H05K 9/0028; H05K 2201/10303; H05K 3/325; H05K 2201/10393; H05K 2201/10401; Y10S 439/948; H01L 2023/4043; H01L 2023/4062; H01L 2023/4068; H01L 2023/4081; H01L 23/4006
  USPC ........................................................ 361/818
  See application file for complete search history.

(56) References Cited

U.S. PATENT DOCUMENTS

| | | | |
|---|---|---|---|
| 6,392,888 B1* | 5/2002 | Chen | H01L 23/3672 219/56.22 |
| 6,472,742 B1* | 10/2002 | Bhatia | H01L 23/4093 257/713 |
| 6,975,518 B2 | 12/2005 | Frutschy | |
| 7,180,743 B2 | 2/2007 | Chen | |
| 7,604,491 B1 | 10/2009 | Ahmad | |
| 9,907,185 B2 | 2/2018 | Mann | |
| 2005/0029655 A1* | 2/2005 | Wu | H01L 23/3672 257/734 |
| 2007/0035931 A1* | 2/2007 | Kuo | H01L 23/4006 257/E23.084 |
| 2007/0097653 A1 | 5/2007 | Gilliland | |
| 2008/0130238 A1* | 6/2008 | Yang | H01L 23/4093 361/719 |
| 2010/0128442 A1 | 5/2010 | Wu | |
| 2015/0131234 A1* | 5/2015 | Chiang | H05K 1/0216 361/719 |
| 2015/0245464 A1 | 8/2015 | Kuganesan | |
| 2016/0227673 A1 | 8/2016 | Ramones | |
| 2018/0115094 A1 | 4/2018 | Tadele | |

OTHER PUBLICATIONS http://www.zhizhan.com.cn/en/products_show.aspx?id=308, "CT-1025E Servo Press-fit Machine for Precise Connector—CT series pres . . . ", Apr. 15, 2020, pp. 1-48.
MP Divakar, Patent Application Review: Integrated Heat Sink and EMI Shield Assembly (US20160227673), Nov. 1, 2016, pp. 1-8.
Vincotech, "Press Fit Technology", https://www.vincotech.com/technology-innovation/press-fit-te,, printed Feb. 29, 2020, pp. 1-3.

* cited by examiner

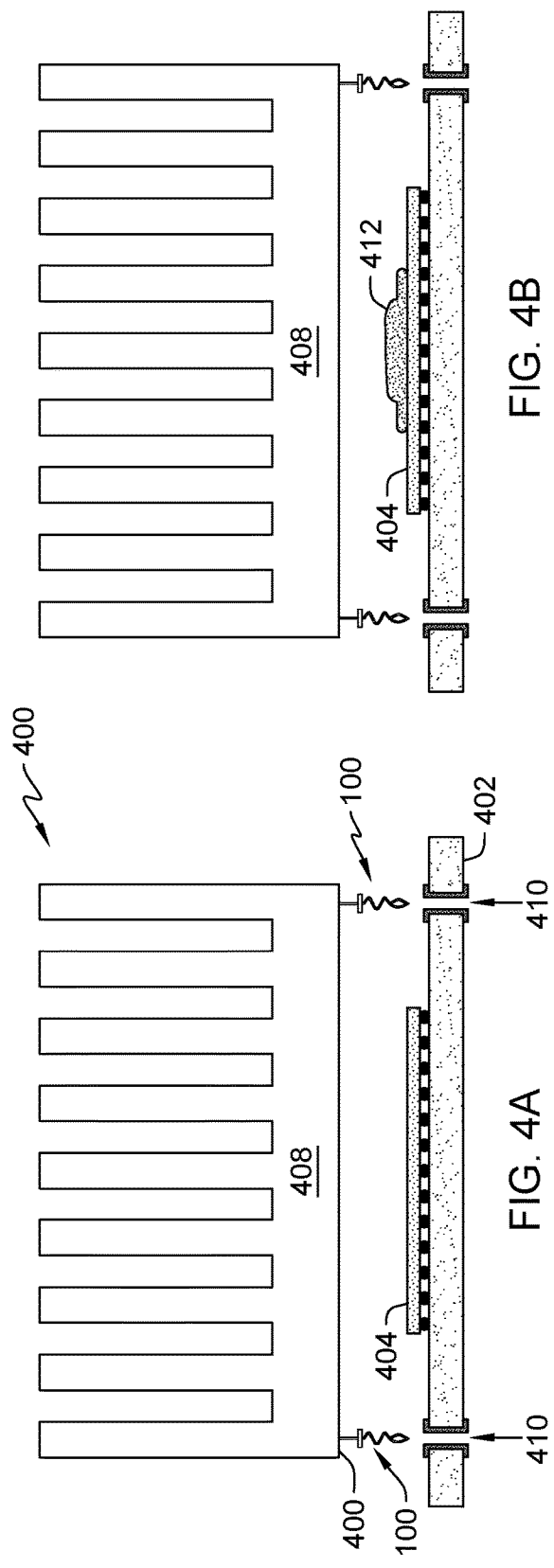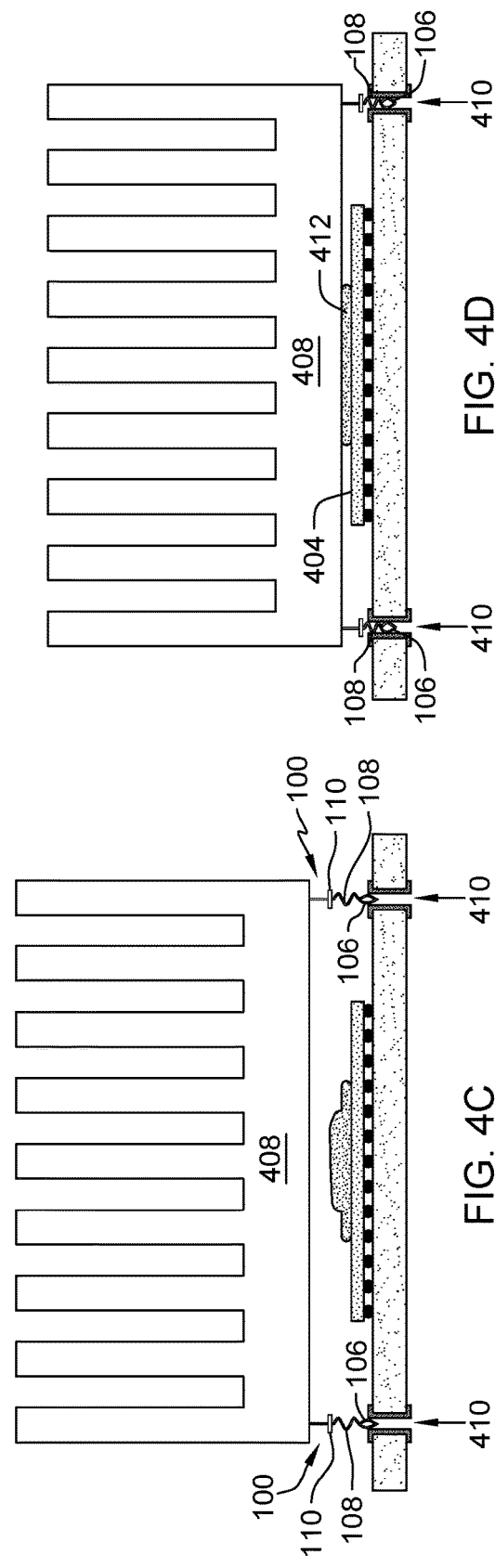

ELECTROMAGNETIC SHIELDING OF HEATSINKS WITH SPRING PRESS-FIT PINS

FIELD OF THE INVENTION

This disclosure relates generally to electromagnetic shielding, and in particular, to electromagnetic shielding of heatsinks utilizing spring press-fit pins for grounding.

BACKGROUND OF THE INVENTION

Metal heatsinks can provide heat dissipation to various components on a printed circuit board (PCB), with an unintended consequence of causing electromagnetic interference (EMI) or noise due to stray currents that are absorbed during routine operations. The stray currents typically occur when voltages of various components or power transistors fluctuate, resulting in an emission of capacitance into the metal heatsink. Electromagnetic shielding on the metal heatsink reduces the intensity of an electromagnetic field in a given space by blocking the electromagnetic field utilizing various barrier and grounding techniques. By grounding out the metal heatsink, the stray currents can be removed and EMI can be reduced.

SUMMARY

A first aspect of an embodiment of the present invention discloses an apparatus for a grounded heatsink utilizing an EMC spring press-fit pin, the apparatus comprising a printed circuit board, a logic chip, a heatsink, and a grounding member, wherein the grounding member includes an integrated spring and a first terminal pin at a first end of the grounding member; the logic chip electrically coupled to the printed circuit board; the heatsink disposed on a top surface of the logic chip; and the first terminal pin at the first end of the grounding member disposed in a plated-through hole of the printed circuit, wherein the grounding member is configured to electrically couple the heatsink to the printed circuit board.

A second aspect of an embodiment of the present invention discloses a method comprising, attaching a first end of a grounding member to heatsink; providing a printed circuit board with a plated-through hole and a logic chip; applying a thermal interface material on a top surface of the logic chip; aligning the heatsink with the grounding member over the thermal interface material on the top surface of the logic chip, wherein a terminal pin at a second end of the grounding member at least partially aligns with the plated-through hole; and applying a load to the heatsink, wherein the terminal pin at the second end is configured to insert into the plated-through hole when applying the load to the heatsink.

A third aspect of an embodiment of the present invention discloses a method comprising, providing a printed circuit board with a plated-through hole and a logic chip; applying a thermal interface material on a top surface of the logic chip; aligning the heatsink over the thermal interface material on the top surface of the logic chip, wherein a pin aperture of the heatsink at least partially aligns with the plated-through hole; applying a load to the heatsink; curing the thermal interface material disposed between a bottom surface of the heatsink and the top surface of the logic chip; and inserting a grounding member through the pin aperture and into the plated-through hole, wherein the grounding member is configured to ground the heatsink to the printed circuit boards.

BRIEF DESCRIPTION OF THE SEVERAL VIEWS OF THE DRAWINGS

The following detailed description, given by way of example and not intended to limit the disclosure solely thereto, will best be appreciated in conjunction with the accompanying drawings, in which:

FIG. 4A depicts a heatsink with multiple EMC spring press-fit pins positioned over a printed circuit board with plated-through holes and logic chip, in accordance with an embodiment of the present invention.

FIG. 4B depicts a heatsink with multiple EMC spring press-fit pins positioned over a printed circuit board with plate-through holes, logic chip, and thermal interface material, in accordance with an embodiment of the present invention.

FIG. 4C depicts a heatsink with multiple EMC spring press-fit pins aligned with plated-through holes of a printed circuit board with logic chip and thermal interface material, in accordance with an embodiment of the present invention.

FIG. 4D depicts a heatsink with multiple EMC spring press-fit pins disposed within plated-through holes of a printed circuit board with logic chip and thermal interface material, in accordance with an embodiment of the present invention.

DETAILED DESCRIPTION

Figure 1:
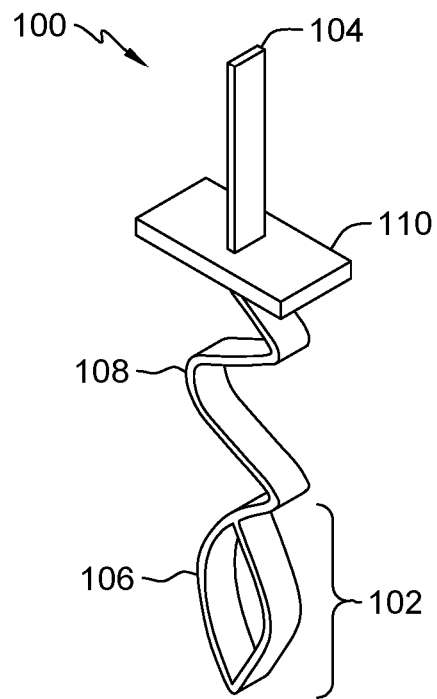
FIG. 1 depicts an EMC spring press-fit pin with an integrated spring and load bar, in accordance with an embodiment of the present invention.

Embodiments of the present invention provide an apparatus and method for grounding heatsink mounted on a logic chip to reduce electromagnetic interference (EMI). EMC spring press-fit pins can be utilized to ground the heatsink to a plated-through hole on a printed circuit board. The EMC spring press-fit pins can be integrated into a design of the heatsink, separated from the design of the heatsink, and/or utilize a double terminal pin. A first embodiment includes a first end of an EMC spring press-fit pin spot welded and/or soldered to a heatsink. A load applied to the heatsink during the assembly process translates via a load bar to an integrated spring and terminal pin at a second end of the EMC spring press-fit pin, forcing the terminal pin into the plated-through hole on the printed circuit board. A second embodiment includes utilizing a press-fit sleeve to insert a terminal pin at a first end of an EMC spring press-fit pin into a plated-through hole, removing the sleeve, and applying a load to the heatsink. A connection point is established between a lower surface of the heatsink and a second end of the EMC spring press-fit pin when the load is applied to the heatsink. A third embodiment includes utilizing an EMC spring press-fit pin with a lower terminal and an upper terminal, where the lower terminal is disposed in a plated-through hole and the upper terminal is disposed in a pin aperture in a heatsink.

For purposes of the description hereinafter, terms such as "upper", "lower", "right", "left", "vertical", "horizontal", "top", "bottom", and derivatives thereof shall relate to the disclosed structures and methods, as oriented in the drawing figures. Terms such as "above", "overlying", "atop", "on top", "positioned on" or "positioned atop" mean that a first element, such as a first structure, is present on a second element, such as a second structure, wherein intervening elements, such as an interface structure may be present between the first element and the second element. The term "direct contact" means that a first element, such as a first structure, and a second element, such as a second structure, are connected without any intermediary conducting, insulating or semiconductor layers at the interface of the two elements. The term substantially, or substantially similar, refer to instances in which the difference in length, height, or orientation convey no practical difference between the definite recitation (e.g. the phrase sans the substantially similar term), and the substantially similar variations. In one embodiment, substantial (and its derivatives) denote a difference by a generally accepted engineering or manufacturing tolerance for similar devices, up to, for example, 10% deviation in value or 10° deviation in angle.

In the interest of not obscuring the presentation of embodiments of the present invention, in the following detailed description, some processing steps or operations that are known in the art may have been combined together for presentation and for illustration purposes and in some instances may have not been described in detail. In other instances, some processing steps or operations that are known in the art may not be described at all. It should be understood that the following description is rather focused on the distinctive features or elements of various embodiments of the present invention.

FIG. 1 depicts an EMC spring press-fit pin with an integrated spring and load bar, in accordance with an embodiment of the present invention. EMC spring press-fit pin 100 includes press-fit zone 102, attachment point 104, terminal pin 106, integrated spring 108, and load bar 110, where press-fit zone 102 represents a deformable portion of EMC spring press-fit pin 100 for insertion into a plated-through hole on a printed circuit board (PCB). EMC spring press-fit pin 100 can be any electrically conductive material and couples to a heatsink at attachment point 104, where EMC spring press-fit pin 100 provides an electrical ground between the heatsink and the plated-through hole on the PCB. EMC spring press-fit pin 100 is coupled to a lower surface of the heatsink utilizing spot welding and/or solder.

EMC spring press-fit pin 100 allows for an absorption of disruptive forces during a mechanical attachment process of a heatsink to a logic chip on the PCB, when terminal pin 106 is inserted into the plated-through hole on the PCB. Integrated spring 108 provides the absorption during the mechanical attachment process of the heatsink, while maintaining integrity of thermal interface material bonding between the heatsink and logic chip onto which the heatsink is disposed. Integrated spring 108 can be a pogo pin, a helical spring, a conical spring, a multiple bend spring, a leaf spring, or any other elastic object capable of storing mechanical energy. Load bar 110 allows for a force applied to the heatsink during the heatsink attachment process to translate to integrated spring 108 and transition to terminal pin 106. In some embodiments, a removeable spacer can be utilized between the lower surface of the heatsink and load bar 110 during the mechanical attachment process to fully actuate integrated spring 108 during insertion into the plated-through hole. EMC spring press-fit pin 100 is discussed in further detail with regards to FIG. 4A.

Figure 2:
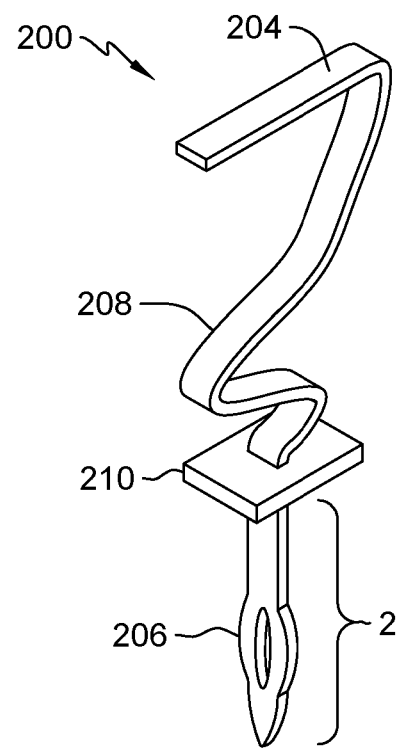
FIG. 2 depicts an EMC spring press-fit pin with an integrated compressible load spring, in accordance with an embodiment of the present invention.

FIG. 2 depicts an EMC spring press-fit pin with an integrated compressible load spring, in accordance with an embodiment of the present invention. EMC spring press-fit pin 200 includes press-fit zone 202, connection point 204, terminal pin 206, integrated spring 208, and stop bar 210, where press-fit zone 202 represents a deformable portion of EMC spring press-fit pin 200 for insertion into a plated-through hole on a printed circuit board (PCB). EMC spring press-fit pin 200 can be any electrically conductive material and creates an electrical connection to a heatsink at connection point 204, where EMC spring press-fit pin 200 provides an electrical ground between the heatsink and the plated-through hole on the PCB. A top planar surface of connection point 204 of EMC spring press-fit pin 200 presses against a lower surface of the heatsink, where the heatsink is disposed over a thermal interface material on a logic chip electrically coupled to the PCB.

EMC spring press-fit pin 200 allows for an absorption of disruptive forces during a mechanical attachment process of a heatsink to a logic chip on the PCB, when the heatsink is disposed onto the thermal interface material on the logic chip and during the curing of the thermal interface material.

Integrated spring 208 provides the absorption during the mechanical attachment process of the heatsink, while maintaining integrity of thermal interface material bonding between the heatsink and logic chip onto which the heatsink is disposed. Integrated spring 208 can be a pogo pin, a helical spring, a conical spring, a multiple bend spring, a leaf spring, or any other elastic object capable of storing mechanical energy. Stop bar 210 is pressed against a top surface of the PCB surrounding the plated-through hole and serves as an indicator that terminal pin 206 is fully seated in the plated-through hole. A press-fit sleeve (not illustrated in FIG. 2) is utilized during an insertion process of terminal pin 206 into the plated-through hole to ensure a structural shape of integrated spring 208 is maintained. The press-fit sleeve is removable upon terminal pin 206 insertion into the plated-through hole on the PCB. EMC spring press-fit pin 200 is discussed in further detail with regards to FIG. 6A.

Figure 3:
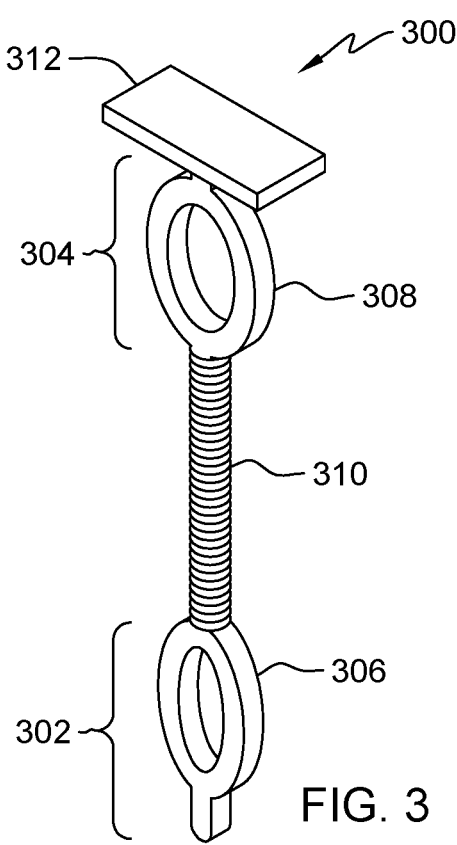
FIG. 3 depicts an EMC spring press-fit pin with an integrated spring and multiple press-fit zones, in accordance with an embodiment of the present invention.

FIG. 3 depicts an EMC spring press-fit pin with an integrated spring and multiple press-fit zones, in accordance with an embodiment of the present invention. EMC spring press-fit pin 300 includes lower press-fit zone 302, upper press-fit zone 304, lower terminal pin 306, upper terminal pin 308, integrated spring 310, and stop bar 312, where lower press-fit zone 302 represents a deformable portion of EMC spring press-fit pin 300 for insertion into a plated-through hole on a printed circuit board (PCB). Upper press-fit zone 304 represents a deformable portion of EMC spring press-fit 300 for insertion into a pin aperture of a heatsink, where the heatsink is disposed over a thermal interface material on a logic chip electrically coupled to the PCB. EMC spring press-fit pin 300 can be any electrically conductive material and creates an electrical connection to the plated-through hole at lower terminal pin 306 and to the heatsink at upper terminal pin 308, where EMC spring press-fit pin 200 provides an electrical ground between the heatsink and the plated-through hole on the PCB.

In some embodiments, EMC spring press-fit pin 300 allows for an absorption of disruptive forces during a mechanical attachment process of a heatsink to a logic chip on the PCB, when the heatsink is disposed onto the thermal interface material on the logic chip and during the curing of the thermal interface material. In other embodiments, EMC spring press-fit pin 300 is inserted subsequent to the attachment of the heatsink and the curing of the thermal interface material between the heatsink and the logic chip. Integrated spring 310 provides the absorption during the mechanical attachment process of the heatsink, while maintaining integrity of thermal interface material bonding between the heatsink and logic chip onto which the heatsink is disposed. Integrated spring 310 can be a pogo pin, a helical spring, a conical spring, a multiple bend spring, a leaf spring, or any other elastic object capable of storing mechanical energy. Stop bar 312 is pressed against a top surface of the pin aperture on the heatsink and serves as an indicator that upper terminal pin 308 is fully seated in the pin aperture, where lower terminal pin 306 is fully seated in the plated-through hole on the PCB. EMC spring press-fit pin 300 is discussed in further detail with regards to FIG. 8A.

FIG. 4A depicts a heatsink with multiple EMC spring press-fit pins positioned over a printed circuit board with plated-through holes and logic chip, in accordance with an embodiment of the present invention. In this embodiment, an assembly process for PCB with grounded heatsink assembly 400 was initialized, where PCB 402 was provided with logic chip 404 disposed on a top surface of PCB 402. Logic chip 404 is electrically and mechanically coupled to the top surface of PCB 402 utilizing a ball grid array (BGA) configuration. Multiple EMC spring press-fit pins 100 are coupled to lower surface 406 of heatsink 408, where each of multiple EMC spring press-fit pins 100 are spot welded and/or soldered to lower surface 406. Heatsink 408 is positioned over PCB 402 such that each of multiple EMC spring press-fit pins 100 aligns with a respective plated-through hole 410 in PCB 402.

FIG. 4B depicts a heatsink with multiple EMC spring press-fit pins positioned over a printed circuit board with plated-through holes, logic chip, and thermal interface material, in accordance with an embodiment of the present invention. Subsequently, thermal interface material 412 is disposed on a top surface of logic chip 404 to enhance thermal and mechanical coupling. Thermal interface material 412 represents an adhesive utilized for heat dissipation between a heat-producing device (i.e., logic chip 404) and a heat-dissipating device (i.e., heatsink 408). Thermal interface material 412 requires a curing process to create a bond between logic chip 404 and heatsink 408.

FIG. 4C depicts a heatsink with multiple EMC spring press-fit pins aligned with plated-through holes of a printed circuit board with logic chip and thermal interface material, in accordance with an embodiment of the present invention. A load is applied to heatsink 408 resulting in terminal pin 106 of each EMC spring press-fit pin 100 to be inserted into a respective plated-through holes 410. Load bar 110 allows for the load applied to heatsink 408 to translate to integrated spring 108 and transition to terminal pin 106 for each EMC spring press-fit pin 100. The properties of each EMC spring press-fit pin 100 is such that the structural shape of each EMC spring press-fit pin 100 is maintained during the load application to heatsink 408 and deformation of each terminal pin 106 upon insertion into a respective plated-through hole 410.

FIG. 4D depicts a heatsink with multiple EMC spring press-fit pins disposed within plated-through holes of a printed circuit board with logic chip and thermal interface material, in accordance with an embodiment of the present invention. As the load is further applied to heatsink 408, terminal pins 106 deform and become seated in plated-through holes 410. Thermal interface material 412 is compressed between logic chip 404 and heatsink 408 under the load to heatsink 408 and subsequently cured to ensure heatsink 408 is bonded to logic chip 404. Upon curation of thermal interface material 412, the load is released from heatsink 408. The releasing of the load from heatsink 408 translates to each integrated spring 108, where each integrated spring 108 can experience rebound while each terminal pins 106 remains seated in respective plated-through holes 410.

Figure 5:
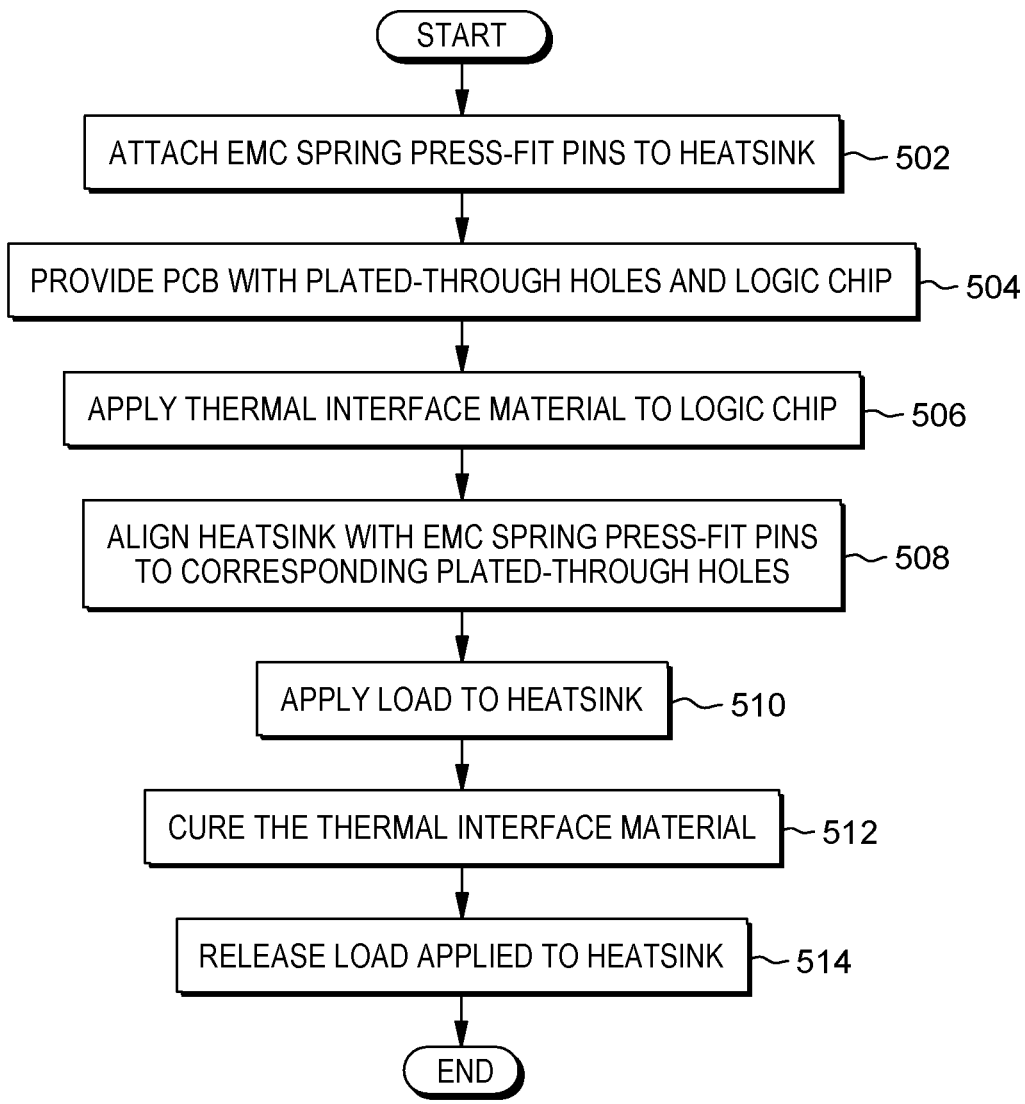
FIG. 5 depicts a process for grounding a heatsink utilizing an EMC spring press-fit pin with an integrated spring and load bar from FIG. 1, in accordance with an embodiment of the present invention.

FIG. 5 depicts a process for grounding a heatsink utilizing an EMC spring press-fit pin with an integrated spring and load bar from FIG. 1, in accordance with an embodiment of the present invention. The process for grounding heatsink 408 to PCB 402 includes attaching (502) EMC spring press-fit pins 100 to heatsink 408. Each EMC spring press-fit pin 100 is attached (i.e., coupled) to lower surface 406 of heatsink 408 utilizing a spot weld and/or solder at attachment point 104, where terminal pin 106 of each EMC spring press-fit pin 100 corresponds to a respective plated-through hole 410 on PCB 402. The process further includes providing (504) PCB 402 with plated-through holes 410 and logic chip 404. Logic chip 404 can be coupled to PCB 402 utilizing a ball grid array configuration, where each plated-through hole 410 is positioned in an area surrounding logic chip 404. Each plated-through hole 410 corresponds to a single EMC spring press-fit pin 100 attached to lower surface 406 of heatsink 408.

The process further includes applying (506) thermal interface material 412 to logic chip 404. As previously discussed, thermal interface material 412 represents an adhesive utilized for heat dissipation between a heat-producing device (i.e., logic chip 404) and a heat-dissipating device (i.e., heatsink 408). Thermal interface material 412 is applied to a top surface of logic chip 404, where a bottom surface of logic chip 404 is coupled to a top surface of PCB 402. The process further includes aligning (508) heatsink 408 with EMC spring press-fit pins 100 to corresponding plated-through holes 410. Aligning heatsink 508 ensures that each terminal pin 106 of each EMC spring press-fit pin 100 is insertable into a correspond plated-through hole 410 when a load is applied to heatsink 408. A vertical centerline of each plated-through hole 410 can align or partially align with a vertical centerline of each terminal pin 106 of EMC spring press-fit pin 100.

The process further includes applying (510) a load to heatsink 408. As lower surface 406 of heatsink 408 is pressed onto thermal interface material 412 disposed on logic chip 404, thermal interface material 412 spreads across the top surface of logic chip 404. Furthermore, heatsink 408 applies a load to each EMC spring press-fit pin 100, where load bar 110 translates the load to integrated spring 108 and transitions the load to terminal pin 106. As a result, terminal pin 106 of each EMC spring press-fit pin 100 is inserted and deformed against the inner walls of a corresponding plated-through hole 410. The process further includes curing (512) thermal interface material 412 and releasing (514) the load applied to heatsink 408. Curing thermal interface material 412 ensures that heatsink 408 bonds to logic chip 404, resulting in a thermal and mechanical coupling between heatsink 408 and logic chip 404. Releasing the load applied to heatsink 408 relieves each EMC spring press-fit pin 100 of the load and thus potentially resulting in rebound in each integrated spring 108.

Figure 6A:
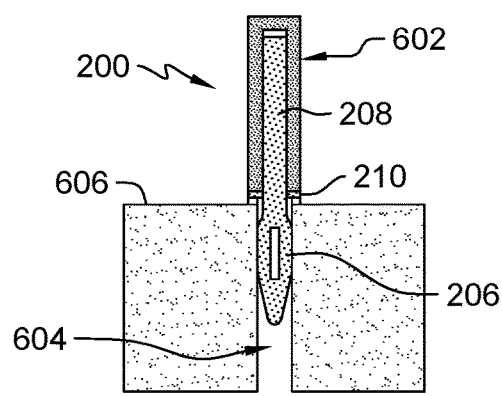
FIG. 6A depicts an enhanced front view of an EMC spring press-fit pin with an integrated compressible load spring pressed into a printed circuit board with sleeve holder, in accordance with an embodiment of the present invention.

FIG. 6A depicts an enhanced front view of an EMC spring press-fit pin with an integrated compressible load spring pressed into a printed circuit board with sleeve holder, in accordance with an embodiment of the present invention. Press-fit sleeve 602 is utilized during an insertion process of EMC spring press-fit pin 200 into plated-through hole 604 on PCB 606. Press-fit sleeve 602 ensures a structural shape of integrated spring 208 is maintained as terminal pin 206 of EMC spring press-fit pin 200 into plated-through hole 604. In this embodiment, press-fit sleeve 602 is U-shaped, where each end of the U-shaped press-fit sleeve contacts a top surface of stop bar 210. As a downward force is applied to press-ft sleeve 602, each end of press-ft sleeve 602 presses against stop bar 210. As a result, terminal pin 206 of EMC spring press-fit pin 200 is inserted and deformed against the inner walls of plated-through hole 604 in PCB 606. Lower surface of stop bar 210 contacting a top surface of PCB 606 indicates that terminal pin 206 of EMC spring press-fit pin 200 is seated in plated-through hole 604.

Figure 6B:
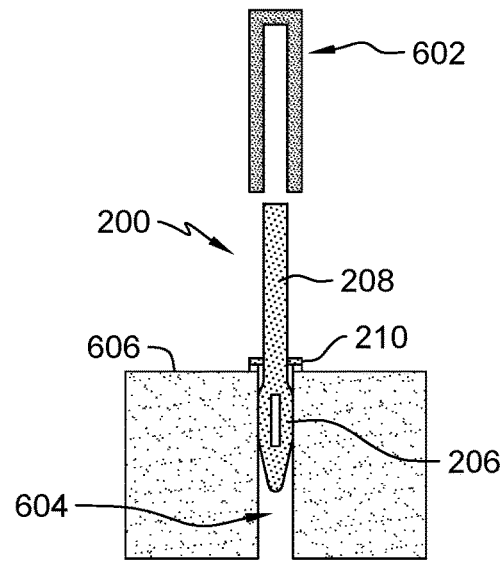
FIG. 6B depicts an enhanced front view of an EMC spring press-fit pin with an integrated compressible load spring disposed in a printed circuit board with sleeve holder removed, in accordance with an embodiment of the present invention.

FIG. 6B depicts an enhanced front view of an EMC spring press-fit pin with an integrated compressible load spring disposed in a printed circuit board with sleeve holder removed, in accordance with an embodiment of the present invention. Subsequently, press-fit sleeve 602 is removed from EMC spring press-fit pin 200 by sliding press-fit sleeve 602 off integrated spring 208 in a vertical motion to ensure a structural shape of integrated spring 208 is maintained. Since, terminal pin 206 has been inserted and deformed against the inner walls of plated-through hole 604, the outward force applied by terminal pin 206 against the inner walls of plated-through hole 604 prevents the movements of EMC spring press-fit pin 200 when the press-fit sleeve 602 is removed. In other embodiments, terminal pin 206 is disposed in a cavity of PCB 606, where an electrical contact for grounding EMC spring press-fit pin 200 is positioned on a top surface of PCB 606 under a lower surface of stop bar 210.

Figure 6C:
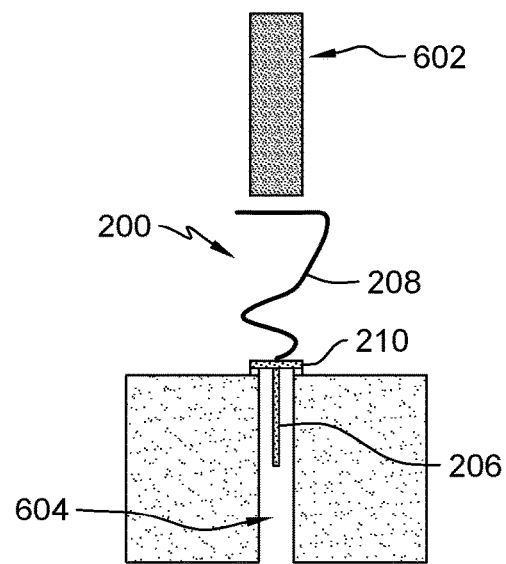
FIG. 6C depicts an enhanced side view of an EMC spring press-fit pin with an integrated compressible load spring disposed in a printed circuit board with sleeve holder removed, in accordance with an embodiment of the present invention.

FIG. 6C depicts an enhanced side view of an EMC spring press-fit pin with an integrated compressible load spring disposed in a printed circuit board with sleeve holder removed, in accordance with an embodiment of the present invention. A side view of EMC spring press-fit pin 200 illustrates that the structural shape of integrated spring 208 is maintained subsequent to insertion of terminal pin 206 into plated-through hole 604 and removal of press-fit sleeve 602. In one embodiment, an adhesive can be used on a top surface of stop bar 210 where each end of the U-shaped press-fit sleeve 602 contacts stop bar 210. The adhesive is strong enough to allow for installation of EMC spring press-fit pin 200 into plated-through hole 604 without press-fit sleeve 602 sliding off integrated spring 208 and potentially damaging the structural shape of 208. Since terminal pin 206 is pressing against the inner walls of plated-through hole 604, the adhesive bond between each end of the U-shaped press-fit sleeve 602 and stop bar 210 is also weak enough that it can subsequently be broken. Thus, allowing for the removal of press-fit sleeve 602, while terminal pin 206 of EMC spring press-fit pin 200 remains inserted in plated-through hole 604. In another embodiment, each end of U-Shape press-fit sleeve 602 is magnetic and allows for a magnetic attraction with a top surface of stop bar 210. The magnetic attraction is strong enough to allow for installation of EMC spring press-fit pin 200 into plated-through hole 604 without press-fit sleeve 602 sliding off integrated spring 208 and potentially damaging the structural shape of 208. However, the magnetic attraction is also weak enough to allow for the removal of press-fit sleeve 602 subsequent to insertion of terminal pin 106 into plated-through hole 604.

Figure 6D:
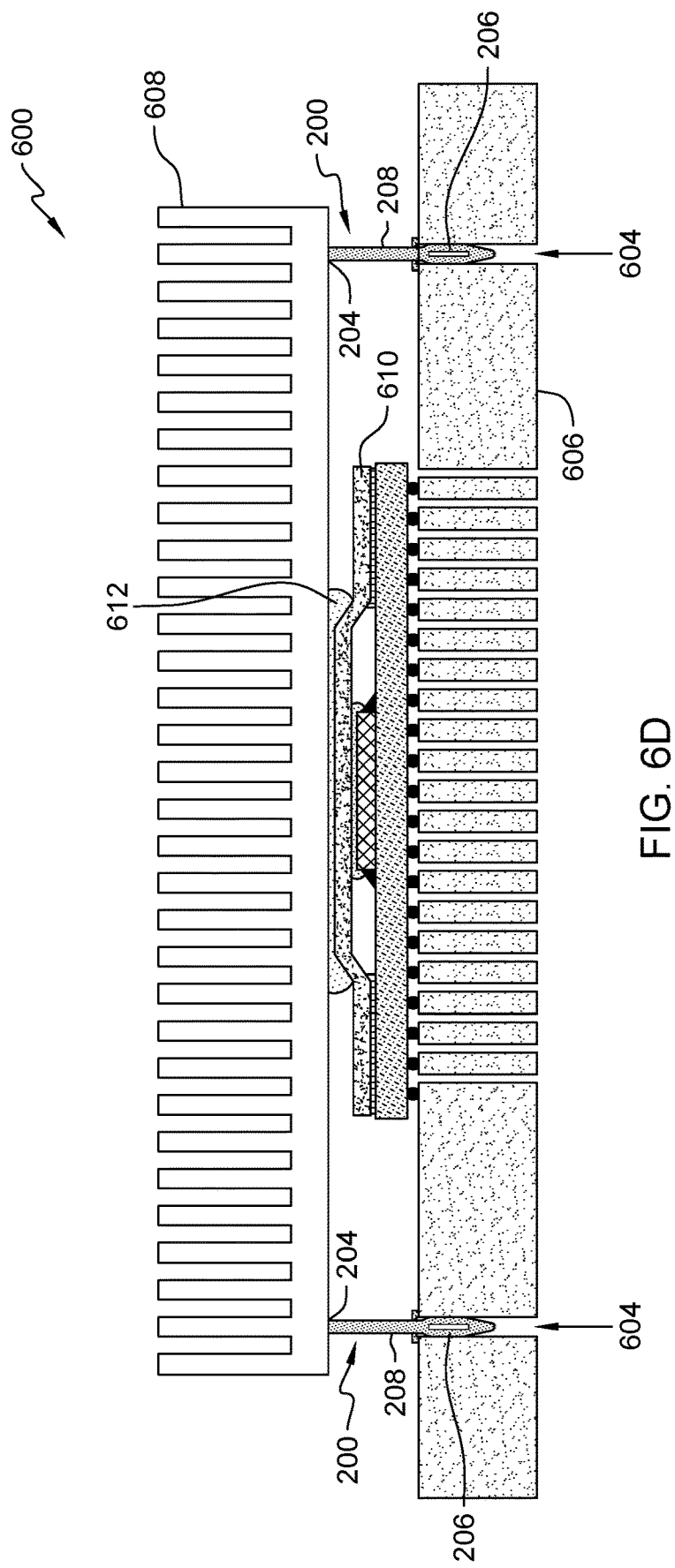
FIG. 6D depicts a heatsink disposed over a logic chip on a print circuit board and multiple EMC spring press-fit pins, in accordance with an embodiment of the present invention.

FIG. 6D depicts a heatsink disposed over a logic chip on a print circuit board and multiple EMC spring press-fit pins, in accordance with an embodiment of the present invention. In this embodiment, grounded heatsink assembly 600 includes heatsink 608 disposed on logic chip assembly 610, where thermal interface material 612 bonds heatsink 608 to logic chip assembly 610. As a load is applied to heatsink 608, connection point 204 of each EMC spring press-fit pin 200 presses against a lower surface of heatsink 608 and an electrical ground is established between heatsink 608 and PCB 606. Thermal interface material 612 is compressed between logic chip assembly 610 and heatsink 608 under the load to heatsink 608 and subsequently cured to ensure heatsink 608 is bonded to logic chip assembly 610. Upon curation of thermal interface material 612, the load is released from heatsink 608. The releasing of the load from heatsink 608 translates to each integrated spring 208, where each integrated spring 208 can experience rebound while each terminal pins 206 remains seated in respective plated-through holes 604.

Figure 7:
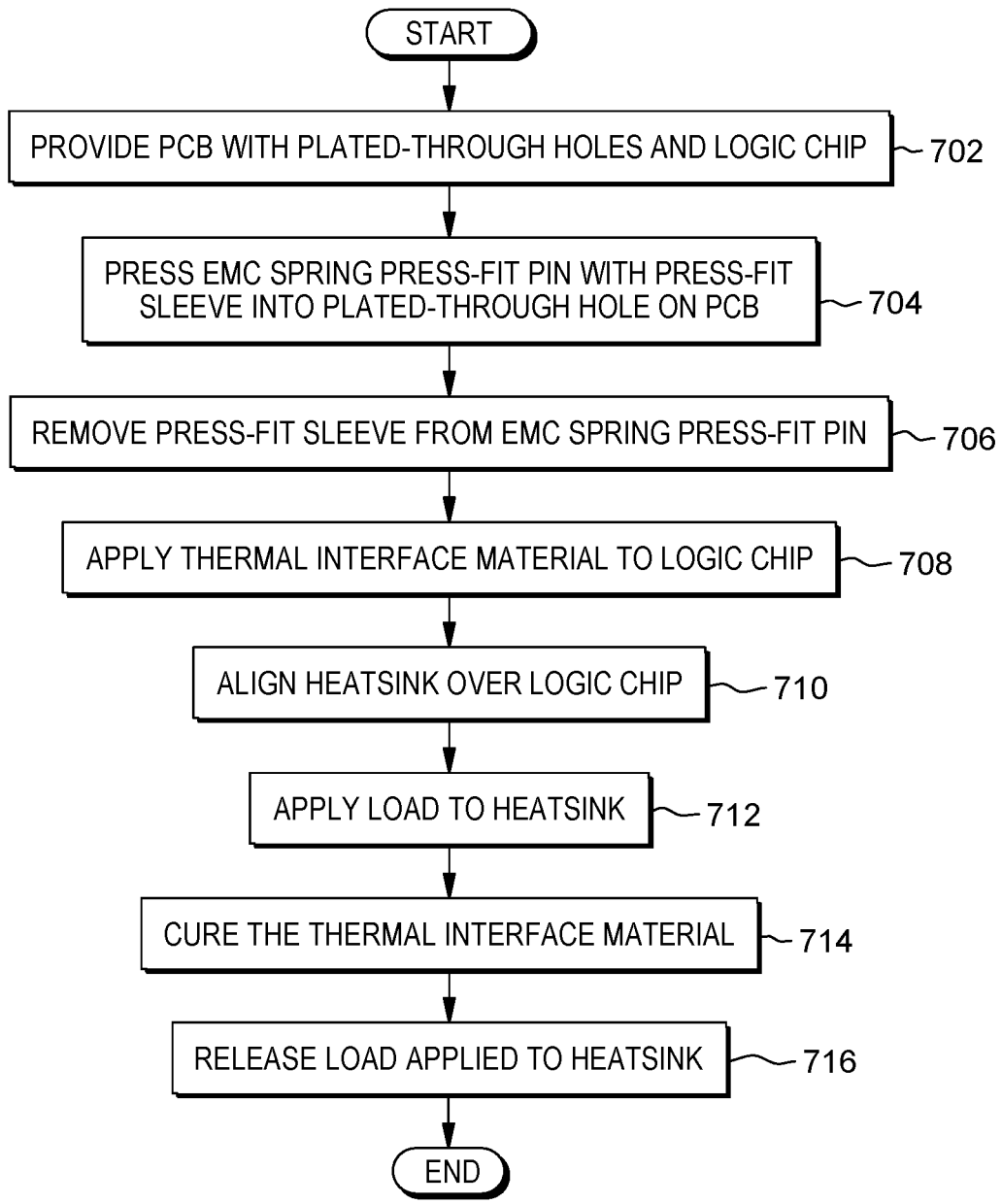
FIG. 7 depicts a process for grounding a heatsink utilizing an EMC spring press-fit pin with an integrated compressible load spring from FIG. 2, in accordance with an embodiment of the present invention.

FIG. 7 depicts a process for grounding a heatsink utilizing an EMC spring press-fit pin with an integrated compressible load spring from FIG. 2, in accordance with an embodiment of the present invention. The process for grounding heatsink 608 to PCB 606 includes providing (702) PCB 606 with plated-through holes 604 and logic chip assembly 610. Logic chip assembly 610 can be coupled to PCB 606 utilizing a ball grid array configuration, where each plated-through hole 604 is positioned in an area surrounding logic chip assembly 610. Each plated-through hole 604 corresponds to a single EMC spring press-fit pin 200 for electrically grounding heatsink 608 to PCB 606. The process further includes pressing (704) EMC spring press-fit pin 200 with press-fit sleeve 602 into plated-through hole 604 in PCB 606. As previously discussed, press-fit sleeve 602 ensures a structural shape of integrated spring 208 is maintained as terminal pin 206 of EMC spring press-fit pin 200 into plated-through hole 604.

The process further includes removing (706) press-fit sleeve 602 from EMC spring press-fit pin 200. Press-fit sleeve 602 is removed from EMC spring press-fit pin 200 by sliding press-fit sleeve 602 off integrated spring 208 in a vertical motion to ensure a structural shape of integrated spring 208 is maintained. Since, terminal pin 206 has been inserted and deformed against the inner walls of plated-through hole 604, the outward force applied by terminal pin 206 against the inner walls of plated-through hole 604 prevents the movements of EMC spring press-fit pin 200 when the press-fit sleeve 602 is removed. The process further includes applying (708) thermal interface material 612 to logic chip assembly 610. As previously discussed, thermal interface material 612 represents an adhesive utilized for heat dissipation between a heat-producing device (i.e., logic chip assembly 610) and a heat-dissipating device (i.e., heatsink 608). Thermal interface material 612 is applied to a top surface of logic chip assembly 610, where a bottom surface of logic chip assembly 610 is coupled to a top surface of PCB 606.

The process further includes aligning (710) heatsink 608 over logic chip assembly 610 and applying (712) a load to heatsink 608. When applying a load to heatsink 608, connection point 204 of each EMC spring press-fit pin 200 presses against the lower surface of heatsink 608 and an electrical ground is established between heatsink 608 and PCB 606. Additionally, thermal interface material 612 is compressed between logic chip assembly 610 and heatsink 608 under the load to heatsink 608. The process further includes curing (714) thermal interface material 612 and releasing (716) the load applied to heatsink 608. Curing thermal interface material 612 ensures that heatsink 608 bonds to logic chip assembly 610, resulting in a thermal and mechanical coupling between heatsink 608 and logic chip assembly 610. Releasing the load applied to heatsink 608 relieves each EMC spring press-fit pin 200 of the load and thus potentially resulting in rebound in each integrated spring 208.

Figure 8:
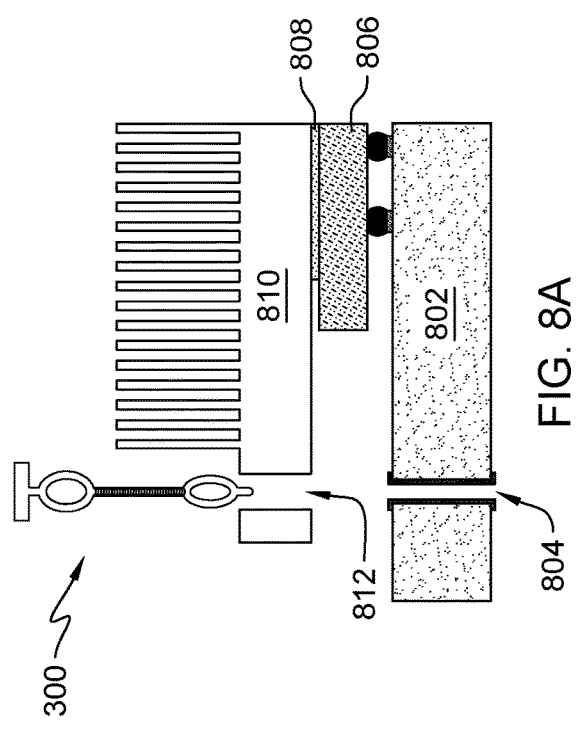
FIG. 8A depicts an enhanced front view of an EMC spring press-fit pin with integrated spring and multiple press-fit zones prior to insertion into a heatsink and printed circuit board, in accordance with an embodiment of the present invention.
FIG. 8B depicts an enhanced front view of an EMC spring press-fit pin with integrated spring and multiple press-fit zones partially inserted into a heatsink, in accordance with an embodiment of the present invention.
FIG. 8C depicts an enhanced front view of an EMC spring press-fit pin with integrated spring and multiple press-fit zones partially inserted into a heatsink and printed circuit board, in accordance with an embodiment of the present invention.
FIG. 8D depicts an enhanced front view of an EMC spring press-fit pin with integrated spring and multiple press-fit zones inserted into a heatsink and printed circuit board, in accordance with an embodiment of the present invention.

FIG. 8A depicts an enhanced front view of an EMC spring press-fit pin with integrated spring and multiple press-fit zones prior to insertion into a heatsink and printed circuit board, in accordance with an embodiment of the present invention. In this embodiment, PCB 802 is provided with plated-through holes 804 and logic chip 806, where thermal interface material 808 is disposed between logic chip 806 and heatsink 810. Pin aperture 812 of heatsink 810 is positioned over plated-through hole 804 on PCB. A vertical centerline of plated-through hole 804 can align or partially align with a vertical centerline of pin aperture 812 of heatsink 810. Prior to insertion, EMC spring press-fit pin 300 is positioned over pin aperture 812, such that a vertical centerline of EMC spring press-fit pin 300 aligns or partially aligns with the vertical centerline of pin aperture 812.

FIG. 8B depicts an enhanced front view of an EMC spring press-fit pin with integrated spring and multiple press-fit zones partially inserted into a heatsink, in accordance with an embodiment of the present invention. As EMC spring press-fit pin 300 is inserted into pin aperture 812, lower terminal pin 306 passes through pin aperture 812 with minimal or no deformation. A width lower terminal pin 306 is equal to or less than a width of pin aperture 812 to allow lower terminal pin 306 to pass through pin aperture 812 with minimal or no deformation prior to insertion into plated-through hole 804. A width of lower terminal pin 306 is greater than a width of plated-through hole 804 and a width of pin aperture 812 is greater than a width of plated-through hole 804.

FIG. 8C depicts an enhanced front view of an EMC spring press-fit pin with integrated spring and multiple press-fit zones partially inserted into a heatsink and printed circuit board, in accordance with an embodiment of the present invention. As the insertion of EMC spring press-fit pin 300 continues, lower terminal pin 306 contacts an opening of plated-through hole 804 and upper terminal pin 308 contacts an opening of pin aperture 812. As previously discussed, a width of lower terminal pin 306 is greater than a width of plated-through hole 804. A width of upper terminal pin 308 is greater than a width of pin aperture 812. As a result, as EMC spring press-fit pin 300 is fully inserted into plated-through hole 804 and pin aperture 812, lower terminal pin 306 and upper terminal pin 308 deform against the inner walls of plated-through hole 804 and pin aperture 812, respectively.

FIG. 8D depicts an enhanced front view of an EMC spring press-fit pin with integrated spring and multiple press-fit zones inserted into a heatsink and printed circuit board, in accordance with an embodiment of the present invention. As EMC spring press-fit pin 300 becomes seated in plated-through hole 804 and pin aperture 812, stop bar 312 is pressed against a top surface of pin aperture 812 on heatsink 810. Stop bar 312 serves as an indicator that upper terminal pin 308 is fully seated in pin aperture 812, where lower terminal pin 306 is fully seated in plated-through hole 804 on the PCB 802. Lower terminal pin 306 deforms against the inner walls of plated-through hole 804 and upper terminal pin 308 deforms against the inner walls of pin aperture 812. An outward force applied by lower terminal pin 306 and upper terminal pin 308 against the inner walls of plated-through hole 804 and pin aperture 812, respectively, prevents the removal of EMC spring press-fit pin 300.

Figure 9:
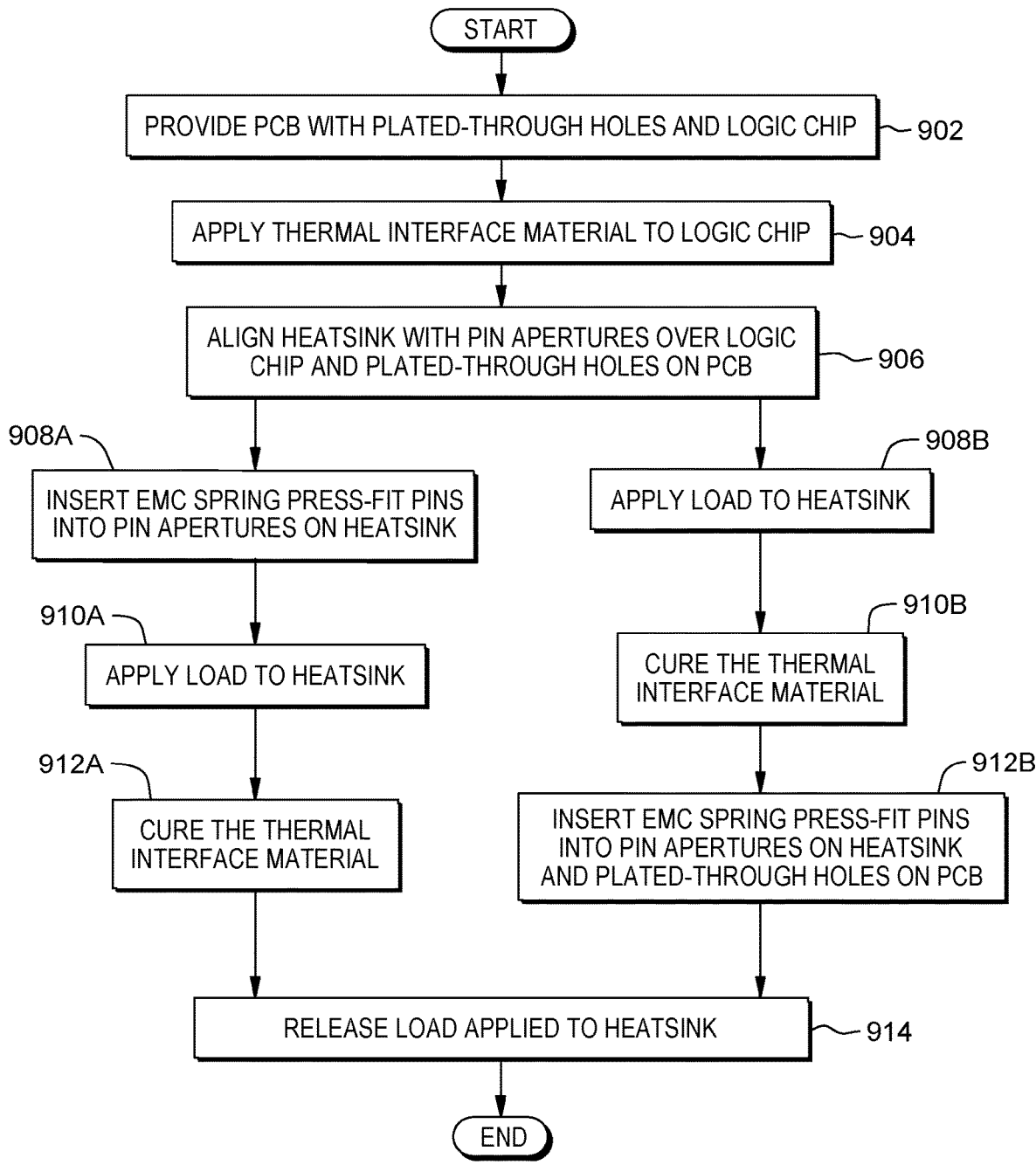
FIG. 9 depicts a process for grounding a heatsink utilizing an EMC spring press-fit pin with an integrated spring and multiple press-fit zones from FIG. 3, in accordance with an embodiment of the present invention.

FIG. 9 depicts a process for grounding a heatsink utilizing an EMC spring press-fit pin with an integrated spring and multiple press-fit zones from FIG. 3, in accordance with an embodiment of the present invention. The process for grounding heatsink 810 to PCB 802 includes providing (902) PCB 802 with plated-through holes 804 and logic chip 806. Logic chip 806 can be coupled to PCB 802 utilizing a ball grid array configuration, where each plated-through hole 804 is positioned in an area surrounding logic chip 806. Each plated-through hole 804 corresponds to a single EMC spring press-fit pin 300 for electrically grounding heatsink 810 to PCB 802. The process further includes applying (904) thermal interface material 808 to logic chip 806. As previously discussed, thermal interface material 808 represents an adhesive utilized for heat dissipation between a heat-producing device (i.e., logic chip 806) and a heat-dissipating device (i.e., heatsink 810). Thermal interface material 808 is applied to a top surface of logic chip 806, where a bottom surface of logic chip 806 is coupled to a top surface of PCB 802.

The process further includes aligning (906) heatsink 810 with pin apertures 812 over logic chip 806 and plated-through holes 804 on PCB 802. Aligning heatsink 810 ensures that each EMC spring press-fit pin 300 is insertable into a corresponding pin aperture 812 and plated-through hole 804. A vertical centerline of each plated-through hole 410 can align or partially align with a vertical centerline of each terminal pin 106 of EMC spring press-fit pin 300. A vertical centerline of plated-through hole 804 can align or partially align with a vertical centerline of pin aperture 812 of heatsink 810.

In a first embodiment, the process further includes inserting (908A) EMC spring press-fit pin 300 into pin apertures 812 on heatsink 810. Prior to attaching heatsink 810, each EMC spring press-fit pin 300 is inserted into a respective pin aperture 812 until upper terminal pin 308 is fully seated and stop bar 312 is pressed against a top surface of pin aperture 812 on heatsink 810. In the first embodiment, the process further includes applying (910A) applying a load to heatsink 810. As a lower surface of heatsink 810 is pressed onto thermal interface material 808 disposed on logic chip 806, thermal interface material 808 spreads across the top surface of logic chip 806. Furthermore, heatsink 810 applies a load to each EMC spring press-fit pin 300, where each lower terminal pin 306 inserts into a respective plated-through hole 804. As a result, lower terminal pin 306 of each EMC spring press-fit pin 300 is inserted and deformed against the inner walls of a corresponding plated-through hole 804. In the first embodiment, the process further includes curing (912A) thermal interface material 808. Curing thermal interface material 808 ensures that heatsink 810 bonds to logic chip 806, resulting in a thermal and mechanical coupling between heatsink 810 and logic chip 806.

In a second embodiment, the process further includes applying (908B) a load to heatsink 810. As previously discussed, as a lower surface of heatsink 810 is pressed onto thermal interface material 808 disposed on logic chip 806, thermal interface material 808 spreads across the top surface of logic chip 806. Pin aperture 812 of heatsink 810 should remain aligned or partially aligned to plated-through holes 804 to ensure that EMC spring press-fit pins 300 can be inserted into pin aperture 812 and plated-through holes 804. In the second embodiment, the process further includes curing (910B) terminal interface material 808. As previously discussed, curing thermal interface material 808 ensures that heatsink 810 bonds to logic chip 806, resulting in a thermal and mechanical coupling between heatsink 810 and logic chip 806. In the second embodiment, the process further includes inserting (912B) EMC spring press-fit pins 300 into pin apertures 812 on heatsink 810 and plated-through holes 804 on PCB 802. As EMC spring press-fit pin 300 becomes seated in plated-through hole 804 and pin aperture 812, stop bar 312 is pressed against a top surface of pin aperture 812 on heatsink 810. Stop bar 312 serves as an indicator that upper terminal pin 308 is fully seated in pin aperture 812, where lower terminal pin 306 is fully seated in plated-through hole 804 on the PCB 802. Lower terminal pin 306 deforms against the inner walls of plated-through hole 804 and upper terminal pin 308 deforms against the inner walls of pin aperture 812.

In both the first and the second embodiment, the process further includes releasing (914) the load applied to heatsink 810. Releasing the load applied to heatsink 810 relieves each EMC spring press-fit pin 300 of the load and thus potentially resulting in rebound in each integrated spring 310.

The terminology used herein is for the purpose of describing particular embodiments only and is not intended to be limiting to the invention. As used herein, the singular forms "a", "an" and "the" are intended to include the plural forms as well, unless the context clearly indicates otherwise.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiment, the practical application or technical improvement over technologies found in the marketplace, or to enable other of ordinary skill in the art to understand the embodiments disclosed herein. It is therefore intended that the present invention not be limited to the exact forms and details described and illustrated but fall within the scope of the appended claims.

What is claimed is:

1. An apparatus comprising:
   a printed circuit board, a logic chip, a heatsink, and a grounding member, wherein the grounding member includes an integrated spring and a first terminal pin at a first end of the grounding member;
   the logic chip electrically coupled to the printed circuit board;
   the heatsink disposed on a top surface of the logic chip;
   a thermal interface material disposed between the top surface of the logic chip and a bottom surface of the heatsink;
   the first terminal pin at the first end of the grounding member disposed in a plated-through hole of the printed circuit board, wherein the grounding member electrically couples the heatsink to the printed circuit board; and
   a load bar of the grounding member translates a load applied to the heatsink during an assembly process to the integrated spring and the first terminal pin;
   the integrated spring of the grounding member presses a second end of the grounding member against the bottom surface of the heatsink, wherein the second end of the grounding member electrically couples the heatsink to the grounding member.

2. The apparatus of claim 1, further comprising:
   a second end of the grounding member electrically coupled to the heatsink utilizing at least one spot weld.

3. The apparatus of claim 1, further comprising:
   a second end of the grounding member electrically coupled to the heatsink utilizing solder.

4. The apparatus of claim 1, wherein the integrated spring is selected from a group consisting of: a pogo pin, a helical spring, a conical spring, a multiple bend spring, and a leaf spring.

* * * * *